(12) United States Patent
Eggermont et al.

(10) Patent No.: US 10,115,818 B1
(45) Date of Patent: Oct. 30, 2018

(54) REDUCING MOSFET BODY CURRENT

(71) Applicant: SEMICONDUCTOR COMPONENTS INDUSTRIES, LLC, Phoenix, AZ (US)

(72) Inventors: Jean-Paul Eggermont, Pellaines (BE); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/871,231

(22) Filed: Jan. 15, 2018

Related U.S. Application Data

(60) Provisional application No. 62/549,403, filed on Aug. 23, 2017.

(51) Int. Cl.
*H01L 29/78* (2006.01)
*H01L 29/06* (2006.01)
(Continued)

(52) U.S. Cl.
CPC .... *H01L 29/7826* (2013.01); *H01L 21/76224* (2013.01); *H01L 21/823481* (2013.01); *H01L 21/823493* (2013.01); *H01L 27/0623* (2013.01); *H01L 27/0629* (2013.01); *H01L 27/0922* (2013.01); *H01L 29/063* (2013.01);
(Continued)

(58) Field of Classification Search
CPC ....... H01L 21/76224; H01L 21/823481; H01L 21/823493; H01L 27/0623; H01L 27/0629; H01L 27/0922; H01L 29/063; H01L 29/0646; H01L 29/0649; H01L 29/1087; H01L 29/7826; H03K 17/063
See application file for complete search history.

(56) References Cited

U.S. PATENT DOCUMENTS 5,430,403 A * 7/1995 Moyer ................ H01L 29/1087
327/565
5,767,733 A * 6/1998 Grugett ................ H03K 17/063
327/436
(Continued)

OTHER PUBLICATIONS

Jean-Paul Eggermont, "Current Sense Element for Current Regulated Circuit and the Like and Method Therefor," U.S. Appl. No. 15/297,324, filed Oct. 19, 2016, 35 pages.

*Primary Examiner* — Allan R Wilson
(74) *Attorney, Agent, or Firm* — Ramey & Schwaller, LLP

(57) ABSTRACT

An illustrative bidirectional MOSFET switch includes a body region, a buried layer, a gate terminal, a first configuration switch, and a second configuration switch. The body region is a semiconductor of a first type separating a source region and a drain region that are a semiconductor of a second type. The buried layer is a semiconductor of the second type separating the body region from a substrate that is a semiconductor of the first type. The gate terminal is drivable to form a channel in the body region, thereby enabling conduction between the source terminal and the drain terminal. The first configuration switch disconnects the body terminal from the source terminal when the source terminal voltage exceeds the drain terminal voltage; and the second configuration switch connects the body terminal to the buried layer terminal when the source terminal voltage exceeds the drain terminal voltage.

21 Claims, 4 Drawing Sheets

(51) Int. Cl.
*H01L 29/10* (2006.01)
*H03K 17/06* (2006.01)
*H01L 21/8234* (2006.01)
*H01L 21/762* (2006.01)
*H01L 27/06* (2006.01)
*H01L 27/092* (2006.01)

(52) U.S. Cl.
CPC ...... *H01L 29/0646* (2013.01); *H01L 29/0649* (2013.01); *H01L 29/1087* (2013.01); *H03K 17/063* (2013.01)

(56) References Cited

U.S. PATENT DOCUMENTS

| | | | |
|---|---|---|---|
| 6,232,827 B1 * | 5/2001 | De | H01L 27/0928 257/E27.067 |
| 6,528,850 B1 * | 3/2003 | Hebert | H01L 21/26513 257/345 |
| 7,123,077 B2 * | 10/2006 | Chiu | H02M 3/073 327/536 |
| 9,748,330 B2 | 8/2017 | Janssens | |
| 2002/0096723 A1 * | 7/2002 | Awaka | H01L 27/088 257/360 |
| 2004/0070441 A1 | 4/2004 | Bringivijayaraghavan | |
| 2005/0017688 A1 | 1/2005 | Stellberger | |
| 2006/0220727 A1 | 10/2006 | Yen | |
| 2010/0001351 A1 * | 1/2010 | Zhang | H01L 27/0207 257/392 |
| 2016/0104781 A1 | 4/2016 | Janssens et al. | |
| 2017/0040993 A1 | 2/2017 | Janssens | |

* cited by examiner

REDUCING MOSFET BODY CURRENT

CROSS-REFERENCE TO RELATED APPLICATIONS

The present application claims priority to Provisional U.S. Application 62/549,403, filed 2017 Aug. 23 by inventors Jean-Paul Eggermont and Johan Camiel Julia Janssens. The provisional is hereby incorporated herein by reference.

BACKGROUND

There are many industrial and automotive applications in which an integrated circuit (IC) switch is used to control current supplied to external components such as solenoids, relays, and motors; and such IC switches may be included as part of a current regulator, switched mode power supply, or a synchronous rectifier. Electronic-controlled transmissions and antilock brakes often employ such IC switches, as do switched power supplies employing Buck or Flyback architectures operating in discontinuous conduction mode (DCM).

In these and other applications, the IC switches may be called upon to support bidirectional current flow in a controlled manner. When only unidirectional flow is anticipated, there exists an elegant "sense transistor" technique for monitoring the current density through the switch. However, for reverse current flows through metal-oxide-semiconductor field-effect transistors (MOSFETs) the sense-transistor technique becomes inaccurate. An approach based on existing techniques would require the use of current monitoring circuitry that adds undesirable complexity and cost to the IC switches.

SUMMARY

Accordingly, there are disclosed herein IC switch devices and methods for reducing body current in a bidirectional MOSFET switch. As explained herein, the accuracy of reverse current monitoring may be aided by the elimination of body current through reverse-biased MOSFETs. An illustrative embodiment of a bidirectional MOSFET switch includes a body region, a buried layer, a gate terminal, a first configuration switch, and a second configuration switch. The body region is a semiconductor of a first type separating a source region and a drain region that are a semiconductor of a second type, the body region being connected to a body terminal, the source region being connected to a source terminal, and the drain region being connected to a drain terminal. The buried layer is a semiconductor of the second type separating the body region from a substrate that is a semiconductor of the first type, the buried layer being coupled to a buried layer terminal. The gate terminal is drivable to form a channel in the body region, thereby enabling conduction between the source terminal and the drain terminal. The first configuration switch disconnects the body terminal from the source terminal when the source terminal voltage exceeds the drain terminal voltage; and the second configuration switch connects the body terminal to the buried layer terminal when the source terminal voltage exceeds the drain terminal voltage.

An illustrative method of manufacturing a bidirectional MOSFET switch having reduced body current includes: (a) creating an n-type buried layer underlying a p-type body region; (b) forming in the body region an n-type source region and an n-type drain region; (c) providing a gate terminal that is drivable to form a channel in the body region, thereby enabling conduction between the source region and the drain region; (d) connecting a buried layer terminal to the buried layer, a body terminal to the body region, a source terminal to the source region, and a drain terminal to the drain region; (e) coupling a first configuration switch between the body terminal and the source terminal to disconnect the body terminal from the source terminal when the source terminal voltage exceeds the drain terminal voltage; and (f) coupling a second configuration switch between the body terminal and buried layer terminal to connect the body terminal to the buried layer terminal when the source terminal voltage exceeds the drain terminal voltage.

Each of the foregoing embodiments may be employed separately or conjointly, and may optionally include one or more of the following features in any combination: (1) the first type of semiconductor is P-type, and the second type of semiconductor is N-type. (2) the first type of semiconductor is N-type, and the second type of semiconductor is P-type. (3) the first configuration switch disconnects the body terminal from the source terminal when the source terminal voltage exceeds the drain terminal voltage unless the gate terminal is de-asserted, and the second configuration switch connects the body terminal to the buried layer terminal when the source terminal voltage exceeds the drain terminal voltage unless the gate terminal is de-asserted. (4) the first configuration switch connects the body terminal to the source terminal when the drain terminal voltage exceeds the source terminal voltage or the gate terminal is de-asserted, and the second configuration switch disconnects the body terminal from the buried layer terminal when the drain terminal voltage exceeds the source terminal voltage or the gate terminal is de-asserted. (5) the first configuration switch connects the body terminal to the source terminal when the drain terminal voltage exceeds the source terminal voltage, and the second configuration switch disconnects the body terminal from the buried layer terminal when the drain terminal voltage exceeds the source terminal voltage. (6) the buried layer floats while disconnected by the second configuration switch. (7) the first and second configuration switches each comprise an NMOS transistor. (8) the first and second configuration switches each have a body terminal coupled to the MOSFET switch's source terminal regardless of whether the source terminal voltage exceeds the drain terminal voltage. (9) the first and second configuration switches each comprise an anti-series pair of NMOS transistors. (10) a switch controller that drives the first and second configuration switches based at least in part on the drain terminal voltage and the source terminal voltage. (11) the switch controller's driving of the first and second configuration switches is further based on whether the gate terminal is asserted. (12) a first sense transistor coupled between the source terminal and a drain current sensing terminal and a second sense transistor coupled between the drain terminal and a source current sensing terminal, wherein the MOSFET switch monitors forward current using at least the drain current sensing terminal and monitors reverse current using at least the source current sensing terminal. (13) connecting the source terminal to a body region of each of the first and second configuration switches. (14) furnishing the switch with a controller. (15) deriving a forward current sense signal with a first sense transistor coupled to the source terminal and gate terminal. (16) deriving a reverse current sense signal with a second sense transistor coupled to the drain terminal and the gate terminal.

Figure 1:
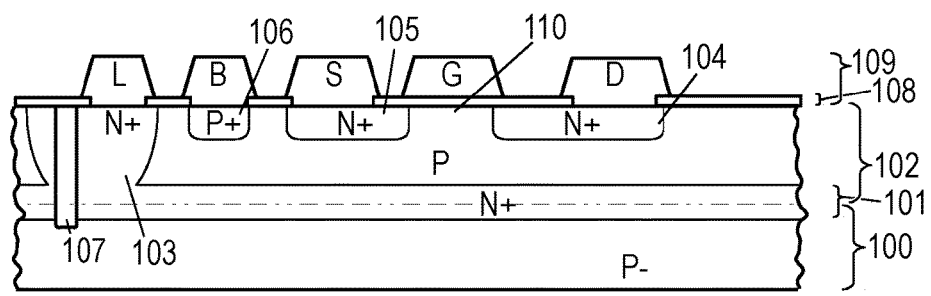
FIG. 1 is a section view of an illustrative MOSFET in accordance with one invention embodiment.

It should be understood that the drawings and corresponding detailed description do not limit the disclosure, but on the contrary, they provide the foundation for understanding all modifications, equivalents, and alternatives falling within the scope of the appended claims. Note that the figures are not drawn to scale.

TERMINOLOGY

The terms "approximately" or "substantially" indicate that an attribute or parameter value is expected to be close to a specified state or number, but that there may be some reasonable variance that would not affect the relevant operating principles of the disclosure. Unless otherwise stated, variances of up to 10% (or in the context of a logarithmic scale, variances of up to a factor of 4) are understood to be reasonable.

The term "conductivity type" refers to the primary mechanism through which current flow occurs in a doped semiconductor, i.e., whether it occurs through motion of holes in the valence band (P-type) or through motion of electrons in the conduction band (N-type). Those skilled in the art will recognize that where such terms are employed in the following description, complementary devices may be obtained by interchanging the conductivity types.

In the following description, the terms "intrinsic", "lightly-doped", "moderately-doped", and "heavily-doped", and "degenerate" are employed to indicate relative degrees of doping. These terms are not intended to indicate definitive numerical ranges, but rather to indicate (on a logarithmic scale) approximate ranges whose upper and lower extremes may be allowed to vary by at least a factor of 4 in either direction. (So long as the relative concentrations of different device regions are maintained, the operating principles may be expected to remain unchanged, albeit with adjusted resistivities, threshold voltages, and current densities.)

In the context of silicon, the term "intrinsic" indicates a dopant concentration of $10^{14}$ atoms/cm$^3$ or less. (Including the allowed factor of 4, this $10^{14}$ threshold may be anywhere in the range $0.25 \times 10^{14}$ to $4 \times 10^{14}$. The following illustrative values are given similar latitude.) "Lightly-doped" indicates a concentration in the range between $10^{14}$ and $10^{16}$ atoms/cm$^3$. "Moderately-doped" indicates a concentration in the range $10^{16}$ to $10^{18}$ atoms/cm$^3$, inclusive. "Heavily-doped" indicates a concentration in the range $10^{18}$ to $10^{20}$ atoms/cm$^3$. "Degenerate" indicates a doping level sufficient to provide an ohmic (non-rectifying) connection with a metal contact (generally greater than $10^{20}$ atoms/cm$^3$). Note that for semiconductors other than silicon, these ranges may vary.

In the context of circuit and device operation, the words "during", "while", and "when", as used herein are not intended to indicate instantaneous effect, but rather should be taken as allowing for some small but reasonable propagation delay or provision of desirable overlap or non-overlap timing. Additionally, the term "while" means that at least that a certain action occurs at least within some portion of a duration of the initiating action.

If used herein, the terms "first", "second", "third", and the like, refer only to the order of presentation in the specification or claims, and do not inherently indicate any required arrangement, ranking, or sequence. Rather, such terms should be regarded as the interchangeable names of similar items.

Reference herein to "one embodiment" or "an embodiment" means that a particular feature, structure or characteristic described in connection with the embodiment is included in at least one possible implementation of the present invention. Thus, appearances of the phrases "in one embodiment" or "in an embodiment" in various places throughout this specification are not necessarily all referring to the same embodiment, but in some cases it may.

DETAILED DESCRIPTION

The manufacturing of semiconductor devices begins with a wafer cut from a semiconductor crystal. The wafer serves as a substrate to which a sequence of operations is applied. Each of the individual operations in the sequence described herein are generally well understood and documented in the open literature, and may include cleaning, etching, deposition, masking, implantation, annealing, diffusion, oxidation, metallization, passivation, and thinning. The precise order (and parameters) of the operations and patterning of the masks determine the structure and function (e.g., IC switch) of the resulting semiconductor device. As each device typically occupies only a small portion (a block or "die") of the substrate, the operations may be designed to create many semiconductor devices at the same time. Once the sequence of processing operations is complete, the individual semiconductor devices may be tested and cut apart ("singulated"). The singulated dies are then packaged to provide solderable leads or contacts that enable the devices to be easily incorporated into electronic circuitry.

To elucidate the source of inaccuracy for sense-transistor monitoring of reverse currents, FIG. 1 shows a section view of an illustrative MOSFET device, including the typical features for guarding against potentially-destructive "latch-up" conditions. Substrate 100 is shown as a lightly-doped p-type (P−) semiconductor, and may be, e.g., a 100- or 110-oriented crystal silicon wafer. (Other substrate materials and dopings are also contemplated.) The precursor for a heavily-doped n-type (N+) buried layer 101, may be provided with a patterned implantation or diffusion of dopants on the substrate 100, which dopants later diffuse into the epitaxial layer 102 from below. Alternatively, epitaxial layer 102 may be formed in stages, with a patterned implantation or diffusion of dopants performed in an early stage to form the buried layer 101.

The bulk of the epitaxial layer 102 is a moderately-doped p-type (P) semiconductor, preferably matching the substrate material. (In other words, if the substrate is silicon, the epitaxial layer is preferably silicon). A deep heavily-doped n-type (N+) well is formed through the epitaxial layer 102, forming an "N-tunnel" 103 that makes the buried layer 101 accessible from the surface. Shallow wells of heavily-doped n-type (N+) semiconductor form the drain region 104 and source region 105 of the MOSFET device, while a heavily-doped p-type (P+) semiconductor well provides an ohmic body connection region 106. (Alternatively, the body connection region 106 may be made with a degenerate level of n-type dopant or p-type dopant.)

Before the shallow regions are formed, however, one or more deep isolation trenches 107 may be etched to define the boundaries of the switch structure. The isolation trenches 107 are filled with an oxide (e.g., $SiO_2$) or another insulating material. A blanket insulating layer 108 may be grown or deposited at the same time as, or subsequent to, the trench fill. The insulating layer 108 may then be patterned and etched as needed to form the shallow regions 104-106.

Once the shallow regions have been formed, the insulating layer 108 may be stripped and replaced with another insulating layer having patterned openings for contact with the metallization layer 109. The metallization layer 109 may be deposited and later etched to define the different terminals, which in this instance include a buried layer terminal L, a body terminal B, a source terminal S, a gate terminal G, and a drain terminal D. Suitable metallization layer materials include Al, AlSi, AlCu, Cu, Au, W, and combinations thereof, optionally provided in sub-layers. The gate terminal G is separated from the device body by a gate oxide thin enough to enable a positive charge on the gate terminal (relative to the voltage potential of the source terminal) to form an inverted n-type channel 110 between the source and drain regions. (The illustrated MOSFET employs an n-type channel, as electrons have a higher mobility and thus provide a lower channel resistivity. However, the principles disclosed herein are also applicable to p-type MOSFETs using polarity adjustments known to those of ordinary skill in the art.)

The P-N junction between the N+ buried layer 101 and the bulk of the p-type epitaxial layer is intended to isolate the body of the switch from substrate 100 and minimize the effect of any substrate current flow on the operation of the switch. To this end, the body terminal B is typically connected to the ground voltage, while the terminal L is typically held at a higher voltage to keep the P-N junction reverse biased, thereby operating as a reverse-biased diode to block current flow across the junction. As the source terminal S is often connected to ground, it is common for the source terminal S to be shorted to (or otherwise combined with) the body terminal B. This technique is effective at reducing bipolar conduction effects and combating latch-up, a condition in which the body of the MOSFET receives current flow from an external source, preventing the device from turning off and potentially causing excessive amplification sufficient to destroy the device. As will be seen from the ensuing description, however, it can be advantageous to keep these terminals separately controllable.

Figure 2A:
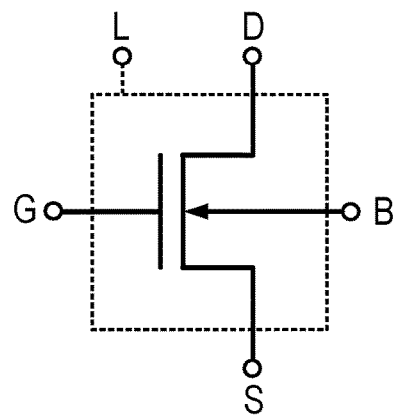
FIG. 2A is a schematic representation of the illustrative MOSFET of FIG. 1.
Figure 2B:
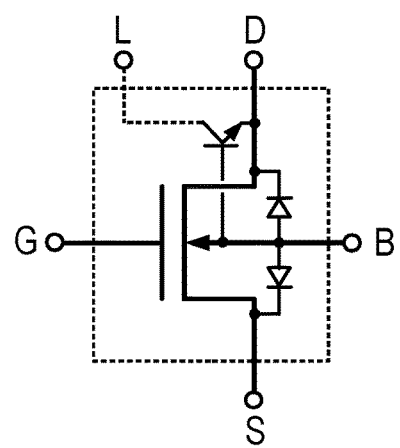
FIG. 2B is a schematic representation that includes the parasitic devices.

FIG. 2A shows a schematic representation including each of the five terminals shown in FIG. 1. The broken outline which connects to the buried layer terminal L represents the buried layer underlying the device. FIG. 2B shows the same schematic representation, with the addition of parasitic diodes representing the possible effects of the P—N junctions between the p-type device body and each of the source and drain regions, and a parasitic bipolar junction transistor (BJT) representing the possible effect of the N—P—N structure created by the buried layer, device body, and drain region. This arrangement of parasitic devices is not the only one possible, nor is it technically complete. However, this particular arrangement highlights the effects that are relevant to the present disclosure.

When the MOSFET is forward-biased (i.e., the voltage on drain terminal D is greater than the voltage on source terminal S), it will operate in response to the voltage on gate terminal G provided that the voltage on the body terminal B does not exceed the source terminal voltage by more than the forward voltage drop of the body-source diode (and hence also fails to exceed the drain terminal voltage by more than the forward voltage drop of the body-drain diode). Interaction of the body and buried layer are also prevented if the buried layer terminal L is biased to prevent current flow across the P-N junction with the device body. Subject to these conditions, all of the current flow through the device occurs via the channel. (We will return to this point later.)

When the MOSFET is reverse-biased (i.e., the drain terminal voltage is less than the source terminal voltage), it will operate in response to the gate terminal voltage provided that the body terminal voltage does not exceed the drain terminal voltage by more than the forward voltage drop of the body-drain diode (and hence also fails to exceed the source terminal voltage by more than the voltage drop of the body-source diode). Again, the buried layer terminal should be biased to prevent current flow across the P-N junction with the device body. Under these conditions, all of the current flow through the device occurs via the channel.

However, where the body-drain voltage grows too large while the MOSFET is reverse-biased (as it could if the body terminal were shorted to ground), current can flow across the junctions represented by the parasitic body-drain diode and via the parasitic BJT. This current flow is not confined to the device channel. Even in the absence of direct current ("DC") flow, the loss and return of the depletion regions at these junctions due to polarity changes is considered a loss of current that slows the switching of the transistor between conducting and non-conducting states ("reverse recovery loss"). The effects are strongly dependent on temperature, and can lead to a positive feedback effect where current leads to a temperature rise that further increases the current and temperature in turn. For the present discussion, the net effect when current is not confined to the device channel becomes the loss of an accurate relationship between the device current and the sensed current.

Figure 3:
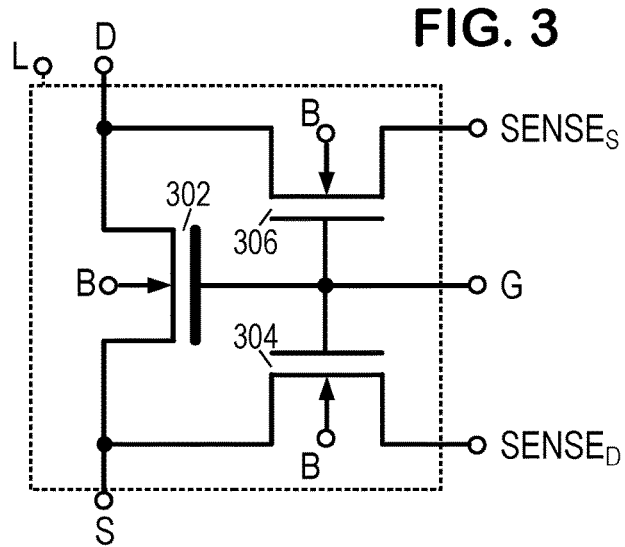
FIG. 3 is a schematic of a switch MOSFET with bidirectional sense transistors.

FIG. 3 shows a schematic of the switch MOSFET 302 augmented by dual sense transistors 304, 306, one for each current direction. This arrangement is at times referred to herein as a "power cell". Though shown separately, the three body terminals B are connected to each other. Thus, sense transistor 304 has the same buried layer, body, and source voltages as the switch MOSFET 302. So long as the sense transistor's drain terminal $SENSE_D$ is kept at the same voltage as the switch MOSFET's drain terminal, both transistors 302 and 304 will draw the same current density through their channels. Similarly, sense transistor 306 has the same buried layer, body, and drain voltages as the switch MOSFET 302. So long as the sense transistor's source terminal $SENSE_S$ is kept at the same voltage as the switch MOSFET's source terminal, both transistors 302 and 306 will draw the same current density through their channel channels. The ratio of sense transistor current to the switch transistor current is governed by the ratio of channel widths for the sense and switch transistors, provided that the current flow is confined to the channel. If the current is not confined in this manner (e.g., under certain reverse bias conditions discussed previously), this relationship breaks down and has been found to be inaccurate.

Coincidently, the SENSE$_S$ terminal voltage can serve as a reference voltage for the SENSE$_D$ terminal under forward biasing conditions, and conversely the SENSE$_D$ terminal voltage can serve as a reference voltage for the SENSE$_S$ terminal under reverse biasing conditions, enabling the bidirectional current measurement to be determined by equalizing the SENSE$_S$ and SENSE$_D$ terminal voltages and measuring the current flowing in either of the sense transistors 304, 306.

Figure 4:
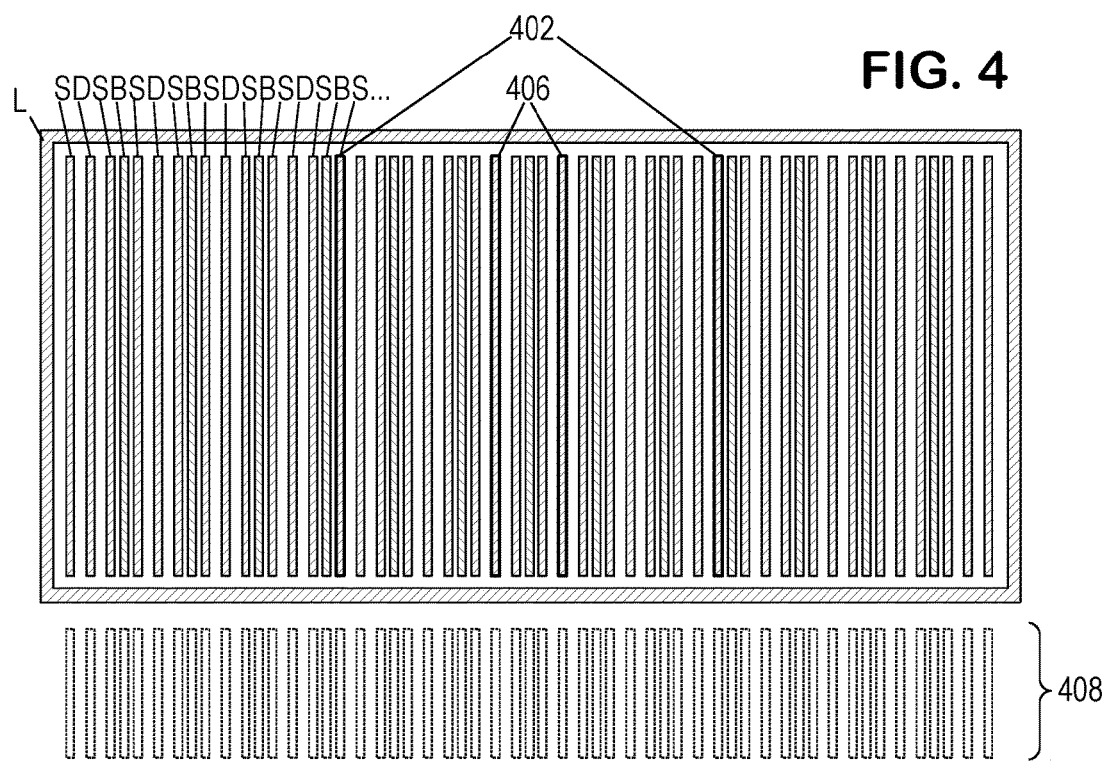
FIG. 4 is a plan view of depositions an illustrative switch MOSFET.

FIG. 4 is shows an illustrative deposition pattern for the power cell, omitting overlying oxide and metal layers for clarity. A series of parallel source (S), drain (D), body (B) depositions are enclosed by a deep N-tunnel deposition for connecting a terminal L to the underlying buried layer. The illustrated sequence of parallel depositions is cyclic in this order: source, drain, source, body. However other ordering and arrangements can also be used to implement the switch transistor. The use of multiple regions enables the effective width of the switch transistor channel to be increased, thereby reducing the switch's resistance when it is ON. The sense transistors can be provided by connecting the terminals for one or more selected source depositions 402 to a SENSE$_S$ terminal rather than the common source terminal S used by the remaining source depositions, and one or more selected drain depositions 404 to a SENSE$_D$ terminal rather than the common drain terminal used by the remaining drain depositions. This intermixing of deposition "fingers" provides for accurate current sensing when the current flow is confined to the channels.

Additional deposition areas 408 may also be provided for the configuration transistors and control logic described below. The body terminals for transistors in this area may be coupled to the source voltage in the typical fashion, while the terminal for any underlying buried layer may be biased to shield these components from current flow in the substrate.

Figure 5A:
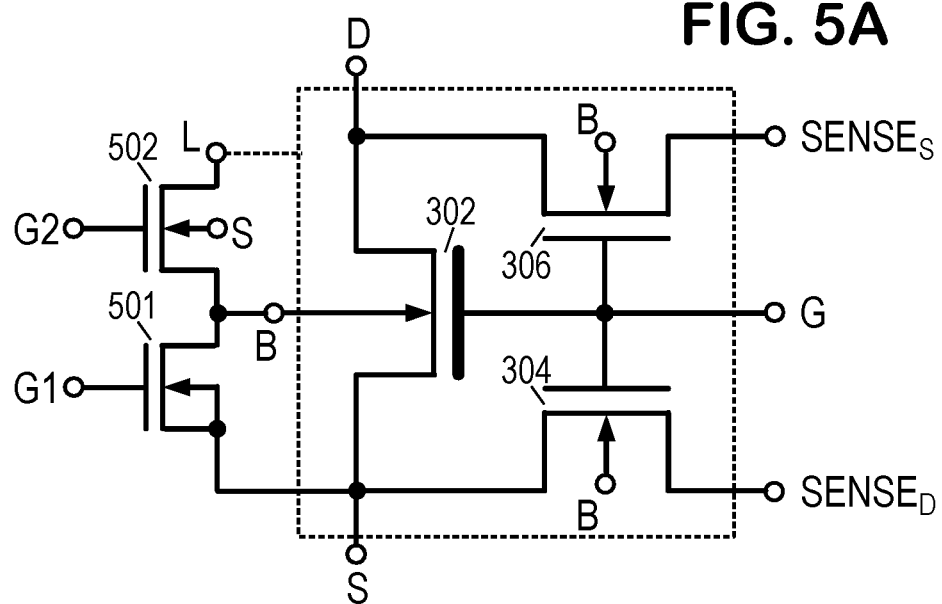
FIG. 5A is a schematic of an improved switch MOSFET.
Figure 5B:
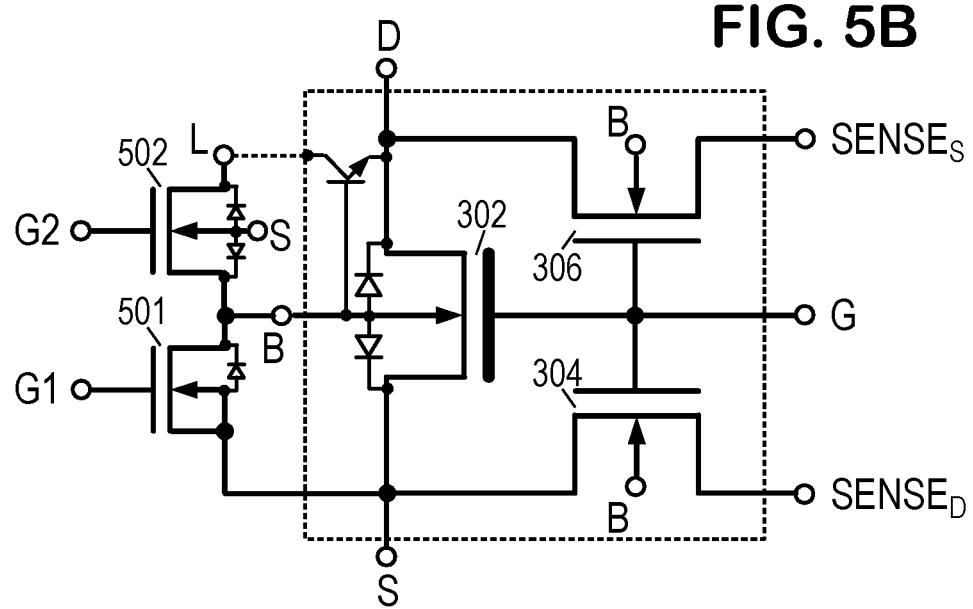
FIG. 5B is a schematic of the improved switch including the parasitic devices.

FIG. 5A is a schematic of an improved switch MOSFET, in which configuration transistors 501, 502 are added to improve the switch's performance under reverse biasing conditions. Configuration transistor 501 operates to controllably connect the switch MOSFET's body terminal B to the source terminal S, and configuration transistor 502 operates to controllably connect the switch MOSFET's body terminal B to the buried layer terminal L. Like the three body terminals B are connected, the two source terminals S are connected. FIG. 5B shows the improved MOSFET switch schematic including the relevant parasitic diodes and BJT.

To configure the switch MOSFET 302 for normal operation (i.e., operation under a forward bias), the gate voltage G1 for configuration transistor 501 is asserted, connecting the body terminal B to the source terminal S. The gate voltage G2 for configuration transistor 502 is de-asserted, leaving the buried layer terminal L in a disconnected, floating state. (As a practical matter, the buried layer potential is kept near or above the voltage of the source terminal S by a parasitic diode representing the P-N junction between the body and drain terminal of configuration transistor 502.) Thus, the switch MOSFET 302 is provided with a typical configuration of features to prevent bipolar currents under forward-biased conditions. Having configuration transistor 502 open when the switch MOSFET 302 is OFF is also beneficial in that it avoids degradation of the switch's snapback voltage.

To configure the switch MOSFET 302 for reverse operation (i.e., operation under a reverse bias), the gate voltage G2 for configuration transistor 502 is asserted (at least while the gate voltage G for the switch MOSFET 302 is asserted), connecting the body terminal B to the buried layer terminal L. The gate voltage G1 for configuration transistor 501 is de-asserted (at least while the gate voltage G for the switch MOSFET 302 is asserted), disconnecting the body terminal B from the source terminal S. Thus, while a reverse current is flowing, the voltage of the body terminal B can fall relative to the voltage of source terminal S by up to one forward voltage drop of the parasitic diodes between the source terminal S and the body terminal B, enabling the body terminal B to follow the voltage of drain terminal D. (In an alternate embodiment where configuration transistors 501, 502 are each implemented as an anti-series pair of NMOS transistors, a much greater voltage drop between the source and body terminals can be sustained.) The switch MOSFET's parasitic body-drain diode prevents the body terminal voltage from exceeding the drain terminal voltage by more than one forward voltage drop of the parasitic diode.

So long as the voltage of drain terminal D does not drop more than the forward voltage drop of two diodes in series (an unlikely occurrence while the switch MOSFET is on), the reverse current through the switch MOSFET will be confined to the inversion channel, enabling an accurate current measurement via sensing transistor 306. Thus, the configuration switches provide an extra diode between the source and bulk terminals, and further provide a current path that prevents the parasitic BJT from influencing the operation of the switch. The current in the parasitic components is negligible, which also minimizes reverse recovery losses.

Configuration options exist when the switch MOSFET 302 is OFF (gate voltage G is deasserted) during reverse bias. In switch embodiments where reverse current flow via the body diode is permitted in the OFF state, the gate voltage G1 for configuration transistor 501 may be asserted, coupling both the body terminal B and the buried layer terminal L to the source terminal S. Gate voltage G2 for configuration transistor 502 may be deasserted, disconnecting the buried layer terminal L from the body terminal B to enable operation of the parasitic BJT towards the isolation diode between buried layer L and the underlying substrate 100. This configuration facilitates out-of-channel current flow that is expected for typical MOSFET switches in this situation, at the cost of accurate current sensing.

In switch embodiments where reverse current flow is undesired in the OFF state, the gate voltage G1 for configuration transistor 501 may be deasserted, disconnecting the body terminal B from the source terminal S. The gate voltage G2 for configuration transistor 502 may be asserted, connecting the body terminal B to the buried layer terminal L. Particularly if an anti-series pair of NMOS transistors is used for each of the configuration transistors, there will be no reverse conduction as long as the reverse breakdown voltage of the body diode is not exceeded. For the illustrated configuration diodes, no significant current flow is expected until the reverse bias exceeds the forward voltage drop of two series diodes. This configuration constrains the current flow to the channel.

Note that the configuration transistors may be low voltage devices. The configuration transistors may be regular NMOS transistors for most applications, but in some embodiments a pair of anti-series NMOS transistors are used to implement each configuration transistor, enabling the configuration transistors to sustain a larger voltage drop because their body diodes are arranged in opposition.

Figure 6A:
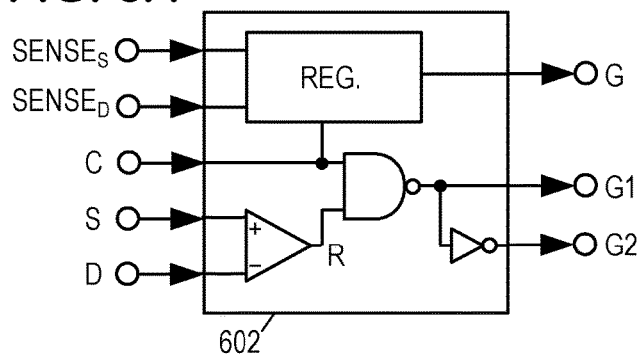
FIGS. 6A, 6B, 6C are logic diagrams of illustrative switch controllers.

FIG. 6A is a logic diagram of an illustrative switch controller 602 that derives the gates signals G, G1, G2 for the switch MOSFET 302, configuration transistor 501, and configuration transistor 502, respectively, from the voltages on source terminal S and drain terminal D, the switch control signal C (asserted when the switch MOSFET is desired to be ON, and deasserted when the switch MOSFET 302 is desired to be OFF), and the current sense signals $SENSE_S$ and $SENSE_D$. The controller compares the source terminal and drain terminal voltages to determine a reverse bias signal R, indicating the presence of a reverse bias. A logic gate combines the reverse bias signal R with the switch control signal C, producing gate voltage G1 which is deasserted only when both inputs are asserted (i.e., the switch is ON and reverse biased), thereby disconnecting the source terminal S from the body terminal B. An inverter provides gate voltage G2 as the logical inverse of G1, asserting G2 only when the switch is ON and reverse biased. This controller 602 implements the embodiment where body current flow is enabled under reverse bias with the switch OFF.

Controller 602 further includes regulator logic that forwards the control signal C as the gate signal G for switch MOSFET 302, subject to modification based on the level of bidirectional current flow derived from the current sense signals $SENSE_S$ and $SENSE_D$. Thus, for example, the controller 602 may enforce current limits by deasserting the gate signal G when a positive or negative current limit is reached. In an alternate embodiment, the gate signal G may simply be a buffered version of the control signal C, and the current sense signals employed to set register values and/or flags that may be communicated to an external source of the control signal C. This alternate embodiment may serve as a redundant source of current sensing to improve control system robustness.

Figure 6B:
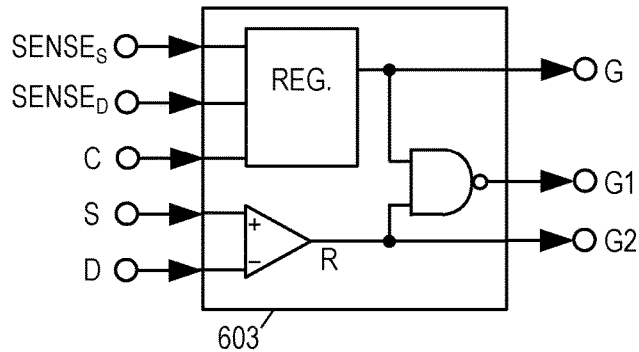

FIG. 6B is a logic diagram of a second illustrative switch controller 603, which operates in a similar fashion to controller 602. Controller 603 differs in that gate signal G1 depends directly on gate signal G rather than directly on control signal C.

Figure 6C:
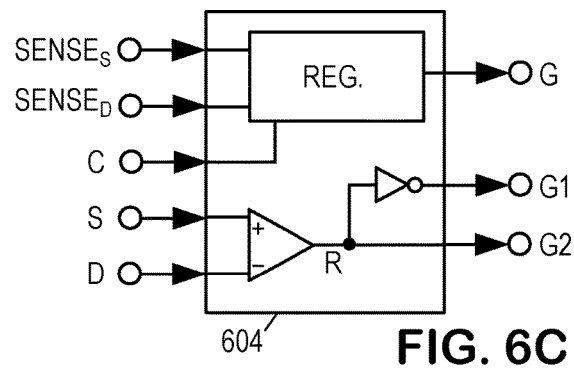

FIG. 6C is a logic diagram of another illustrative switch controller 604. In this example, the gate signals G1 and G2 are no longer dependent on the control signal C. Rather, they depend solely on whether the switch MOSFET is forward biased (in which case G1 is asserted and G2 is deasserted) or reverse biased (in which case G1 is deasserted and G2 is asserted). The regulator of controller 604 may be the same as that of controller 602.

Figure 7:
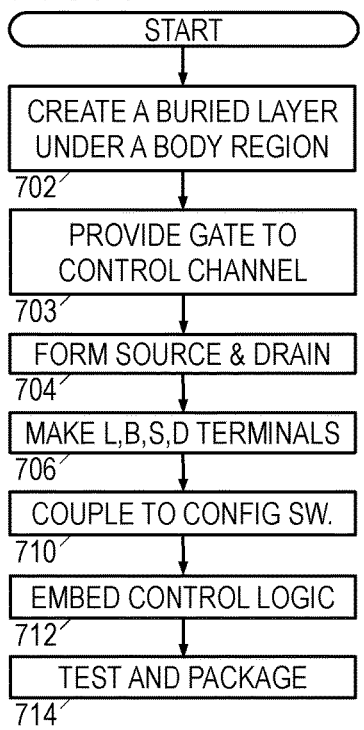
FIG. 7 is a flow diagram of an illustrative body current suppression method.

FIG. 7 is a flow diagram of an illustrative method of manufacturing a bidirectional MOSFET switch having reduced body current. The method begins in block 702 with creating an n-type buried layer underlying a p-type body region. In block 703, a gate electrode (elsewhere referred to as a gate terminal) is provided so as to form a channel in the body region when driven. In block 704, an n-type source region and an n-type drain region are formed in the body region, such that when the gate electrode is asserted, the channel enables conduction between the source region and the drain region.

In block 706, a buried layer terminal is connected to the buried layer, a body terminal is connected to the body region, a source terminal is connected to the source region, and a drain terminal is connected to the drain region. In block 710, a first configuration switch is coupled between the body terminal and the source terminal to disconnect the body terminal from the source terminal when the source terminal voltage exceeds the drain terminal voltage, and a second configuration switch is coupled between the body terminal and buried layer terminal to connect the body terminal to the buried layer terminal when the source terminal voltage exceeds the drain terminal voltage. In block 712, a switch controller is furnished to drive the configuration switches in response to at least the source and drain terminal voltages. Depending on the embodiment, the configuration switches may also be driven in response to whether the gate electrode is asserted. In block 714, the switch is tested, singulated from the wafer, and packaged as a discrete device.

The foregoing designs and methods may enable accurate current sensing in both forward and reverse directions without requiring an external sensing resistor (added cost) or an internal sensing resistor (sensitive to temperature drift). Of course, this current sensing may be used as a backup for another current sensing technique to provide added redundancy and reliability for the system. Even when not employed for current sensing, the technique of reducing body current may be used to reduce the reverse recovery loss and switching time, which may be advantageous for use in synchronous rectifiers and switched-mode power supplies. An added benefit is that normal low voltage NMOS devices can be used for the configuration switches, even if the main switch is implemented as a DMOS switch. The configuration switches can be integrated onto the MOSFET switch die without undue expansion of the required chip area, thereby minimizing cost.

Though the operations shown and described in FIG. 7 are treated as being sequential for explanatory purposes, in practice the method may be carried with steps being performed concurrently or in a different order. The sequential discussion is not meant to be limiting.

Though the foregoing presents the disclosed principles in terms of an n-channel MOSFET, those of ordinary skill in the art will recognize that with an interchange of p-type and n-type regions, a p-channel MOSFET can be implemented with similar advantage.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope. It is evident that many alternatives and variations will be apparent to those skilled in the art. While some embodiments described herein include some but not other features included in other embodiments, combinations of features of different embodiments are meant to be within the scope of the disclosure, and form different embodiments, as would be understood by those skilled in the art. Further, inventive aspects of a given embodiment may lie in less than all of its disclosed features.

What is claimed is:

1. A bidirectional MOSFET switch having reduced body current, the switch comprising:
   a body region that is a semiconductor of a first type separating a source region and a drain region that are a semiconductor of a second type, the body region being connected to a body terminal, the source region being connected to a source terminal, and the drain region being connected to a drain terminal;
   a buried layer that is a semiconductor of the second type separating the body region from a substrate that is a semiconductor of the first type, the buried layer being coupled to a buried layer terminal;
   a gate terminal drivable to form a channel in the body region, thereby enabling conduction between the source terminal and the drain terminal;

a first configuration switch that disconnects the body terminal from the source terminal when the source terminal voltage exceeds the drain terminal voltage; and a second configuration switch that connects the body terminal to the buried layer terminal when the source terminal voltage exceeds the drain terminal voltage.

2. The switch of claim 1, wherein the first type of semiconductor is N-type, and the second type of semiconductor is P-type.

3. The switch of claim 1, wherein the first type of semiconductor is P-type, and the second type of semiconductor is N-type.

4. The switch of claim 3, wherein the first configuration switch disconnects the body terminal from the source terminal when the source terminal voltage exceeds the drain terminal voltage unless the gate terminal is de-asserted, and the second configuration switch connects the body terminal to the buried layer terminal when the source terminal voltage exceeds the drain terminal voltage unless the gate terminal is de-asserted.

5. The switch of claim 4, wherein the first configuration switch connects the body terminal to the source terminal when the drain terminal voltage exceeds the source terminal voltage or the gate terminal is de-asserted, and the second configuration switch disconnects the body terminal from the buried layer terminal when the drain terminal voltage exceeds the source terminal voltage or the gate terminal is de-asserted.

6. The switch of claim 3, wherein the first configuration switch connects the body terminal to the source terminal when the drain terminal voltage exceeds the source terminal voltage, and the second configuration switch disconnects the body terminal from the buried layer terminal when the drain terminal voltage exceeds the source terminal voltage.

7. The switch of claim 6, wherein the buried layer floats while disconnected by the second configuration switch.

8. The switch of claim 3, wherein the first and second configuration switches each comprise an NMOS transistor.

9. The switch of claim 8, wherein the first and second configuration switches each have a body terminal coupled to the MOSFET switch's source terminal regardless of whether the source terminal voltage exceeds the drain terminal voltage.

10. The switch of claim 3, wherein the first and second configuration switches each comprise an anti-series pair of NMOS transistors.

11. The switch of claim 1, further comprising a switch controller that drives the first and second configuration switches based at least in part on the drain terminal voltage and the source terminal voltage.

12. The switch of claim 11, wherein the switch controller's driving of the first and second configuration switches is further based on whether the gate terminal is asserted.

13. The switch of claim 1, further comprising a first sense transistor coupled between the source terminal and a drain current sensing terminal and a second sense transistor coupled between the drain terminal and a source current sensing terminal, wherein the MOSFET switch monitors forward current using at least the drain current sensing terminal and monitors reverse current using at least the source current sensing terminal.

14. A method of manufacturing a bidirectional MOSFET switch having reduced body current, the method comprising:

creating an n-type buried layer underlying a p-type body region;

forming in the body region an n-type source region and an n-type drain region;

connecting a buried layer terminal to the buried layer, a body terminal to the body region, a source terminal to the source region, and a drain terminal to the drain region;

providing a gate terminal that is drivable to form a channel in the body region, thereby enabling conduction between the source terminal and the drain terminal;

coupling a first configuration switch between the body terminal and the source terminal to disconnect the body terminal from the source terminal when the source terminal voltage exceeds the drain terminal voltage; and coupling a second configuration switch between the body terminal and buried layer terminal to connect the body terminal to the buried layer terminal when the source terminal voltage exceeds the drain terminal voltage.

15. The method of claim 14, wherein the first configuration switch disconnects the body terminal from the source terminal when the source terminal voltage exceeds the drain terminal voltage unless the gate terminal is de-asserted, and the second configuration switch connects the body terminal to the buried layer terminal when the source terminal voltage exceeds the drain terminal voltage unless the gate terminal is de-asserted; and wherein the first configuration switch connects the body terminal to the source terminal when the drain terminal voltage exceeds the source terminal voltage or the gate terminal is de-asserted, and the second configuration switch disconnects the body terminal from the buried layer terminal when the drain terminal voltage exceeds the source terminal voltage or the gate terminal is de-asserted.

16. The method of claim 14, wherein the first configuration switch connects the body terminal to the source terminal when the drain terminal voltage exceeds the source terminal voltage, and the second configuration switch disconnects the body terminal from the buried layer terminal when the drain terminal voltage exceeds the source terminal voltage.

17. The method of claim 14, wherein the buried layer floats while disconnected by the second configuration switch.

18. The method of claim 14, wherein the first and second configuration switches each comprise an NMOS transistor, and the method further comprises connecting the source terminal to a body region of each of the first and second configuration switches.

19. The method of claim 14, further comprising: furnishing the switch with a controller that drives the first and second configuration switches based at least in part on the drain terminal voltage and the source terminal voltage.

20. The method of claim 19, wherein the controller's driving of the first and second configuration switches is further based on whether the gate terminal is asserted.

21. The method of claim 14, further comprising:

deriving a forward current sense signal with a first sense transistor coupled to the source terminal and gate terminal; and deriving a reverse current sense signal with a second sense transistor coupled to the drain terminal and the gate terminal.

* * * * *